United States Patent
Gopinathan et al.

(10) Patent No.: US 6,188,291 B1
(45) Date of Patent: Feb. 13, 2001

(54) INJECTION LOCKED MULTI-PHASE SIGNAL GENERATOR

(75) Inventors: Venugopal Gopinathan, Basking Ridge; Peter R. Kinget, Hoboken; David E. Long; Robert C. Melville, both of New Providence, all of NJ (US)

(73) Assignee: Lucent Technologies, Inc., Murray Hill, NJ (US)

( * ) Notice: Under 35 U.S.C. 154(b), the term of this patent shall be extended for 0 days.

(21) Appl. No.: 09/343,228

(22) Filed: Jun. 30, 1999

(51) Int. Cl.[7] ............................. H03B 5/24; H03B 27/00
(52) U.S. Cl. ..................... 331/45; 331/47; 331/55; 331/57; 331/172; 331/175
(58) Field of Search .................. 331/45, 47, 55, 331/57, 153, 172, 175

(56) References Cited

U.S. PATENT DOCUMENTS

| | | | |
|---|---|---|---|
| 5,357,217 | * 10/1994 | Marchesi et al. | 331/57 |
| 5,563,554 | * 10/1996 | Mizuno | 331/57 |
| 5,581,215 | * 12/1996 | Ogasawara | 331/45 |
| 5,592,127 | * 1/1997 | Mizuno | 331/57 |
| 5,635,877 | * 6/1997 | Monk et al. | 331/57 |
| 5,677,650 | * 10/1997 | Kwasniewski et al. | 331/57 |
| 5,864,258 | * 1/1999 | Cusinato et al. | 331/34 |

OTHER PUBLICATIONS

"Fundamental Consideration Of The Stabilization Of an Oscillator By Injection Locking", Electronics and Communications in Japan, vol. 52–B, No. 4, 1969, pp. 73–80; Saito et al.

* cited by examiner

Primary Examiner—David Mis

(57) ABSTRACT

Two or more equal amplitude periodic output signals which are mutually shifted in phase by an integer fraction of 360 degrees, such as 90°, are generated by injection locking a ring type oscillator circuit arrangement with a periodic low phase noise signal source. More particularly, a first ring oscillator is injection locked by a low phase noise signal source, one having a noise characteristic which meets the GSM radio standard of at least −132 dBc/Hz at a 3 MHz offset. An identical second ring oscillator is then driven with the output of the first ring oscillator. In one circuit configuration, an even numbered, e.g., a four stage ring oscillator is injection locked to a low-phase noise oscillator having a predetermined noise specification which is application specific and wherein a second even numbered stage, e.g., a four stage ring oscillator is coupled to the first ring oscillator. In a second circuit configuration, a first odd numbered, e.g., three stage ring oscillator, is injection locked to a low phase-noise oscillator and a second odd numbered, e.g., three stage ring oscillator, is injection locked to the first ring oscillator.

33 Claims, 5 Drawing Sheets

INJECTION LOCKED MULTI-PHASE SIGNAL GENERATOR

TECHNICAL FIELD

This invention relates to electrical signal generators providing a plurality of equal amplitude periodic output signals which are mutually shifted in phase by 360°/n, where n is an integer, particularly a pair of quadrature output signals.

BACKGROUND OF THE INVENTION

Two periodic quadrature signals, typically but not limited to sinusoidal and square wave signals, having equal amplitude but shifted in phase, for example, by one quarter of a period (π/2) or 90° are required for various types of applications, one of which includes wireless communication systems where quadrature signals are needed, for example, for driving a mixer and where sideband and image suppression depends directly on accuracy of the quadrature phase relationship. Existing techniques for generating quadrature signals utilize, among other things, a phasor sum and difference circuit, a divide-by-two or divide-by-four counter or a combination of R-C low-pass and C-R high-pass filters, possibly connected in a feedback loop. Currently, none of these approaches has been found to be entirely satisfactory in terms of quadrature accuracy, power dissipation and/or phase noise.

SUMMARY OF THE INVENTION

The foregoing deficiencies are overcome in accordance with the principles of the invention by generating one or more pairs of periodic extremely phase accurate output signals of equal amplitude by injection locking a ring oscillator with a multi-phase signal generator which generates a first set of phase related output signals. Injection locking refers to the coupling of a signal from an outside source into an oscillator for improving the frequency or phase difference stability of the output signal generated by the oscillator. The multi-phase signal generator is driven by a low phase noise signal source which generates an output signal which meets, for example, a well known noise standard.

In another embodiment, a first multi-stage (even or odd numbered) ring oscillator is injection locked to a low-phase noise oscillator having a predetermined noise specification which is application specific. A second multi-stage differential ring oscillator identical to the first ring oscillator within manufacturing tolerances is coupled to the first ring oscillator and is injection locked thereby so as to generate a plurality of multi-phase outputs which are mutually shifted in phase by an integer fraction phase increment of 360°, i.e., 360°/n where n is an integer, and which provide an improvement in the accuracy of the mutual phase difference over the accuracy of the mutual phase difference of the first ring oscillator and which are, furthermore, insensitive to harmonic distortion in the driving signal. The process of injection locking is relatively fast which results in the reduction of phase noise or "jitter" over a large bandwidth.

DETAILED DESCRIPTION

The phenomenon of injection locking is a fundamental property of oscillators. This property has been noted to occur where an external reference signal having a frequency near the frequency of the free running oscillator is introduced into the oscillator circuit. If the frequency of the injection signal is sufficiently far away from the oscillator frequency, the free running oscillator output will contain components of the two frequencies. When the injection frequency is brought close to the oscillator frequency, there will come a point at which the frequency of the free running oscillator is pulled toward the injection frequency. Frequency change toward the injection frequency will continue as the injection frequency continues to move toward the oscillator frequency until a critical value is reached, whereupon the free running, frequency of the oscillator will "lock" into synchronism with the injection frequency. Once this occurs, the injection frequency can be varied within a certain "lock band" and the output frequency of the oscillator will track the reference injection frequency. The lock band is a function of the amplitude of the injection frequency signal, for example, as the signal strength of the injection frequency increases so does the width of the lock band. Moreover, if the reference signal, i.e., the injection locking signal, has a phase noise characteristic superior to that of the free running oscillator, the process of injection locking will "clean up" the phase noise of the free running oscillator when it is locked to the injection locking signal, a condition which is known as being "in lock".

The principle of injection locking has also been described in a publication entitled "Fundamental Consideration Of The Stabilization Of An Oscillator By Injection Locking", T. Saito et al, *Electronics and Communications in Japan,* Vol. 52-B, No. 4, 1969, pp. 73–80.

Figure 1A:
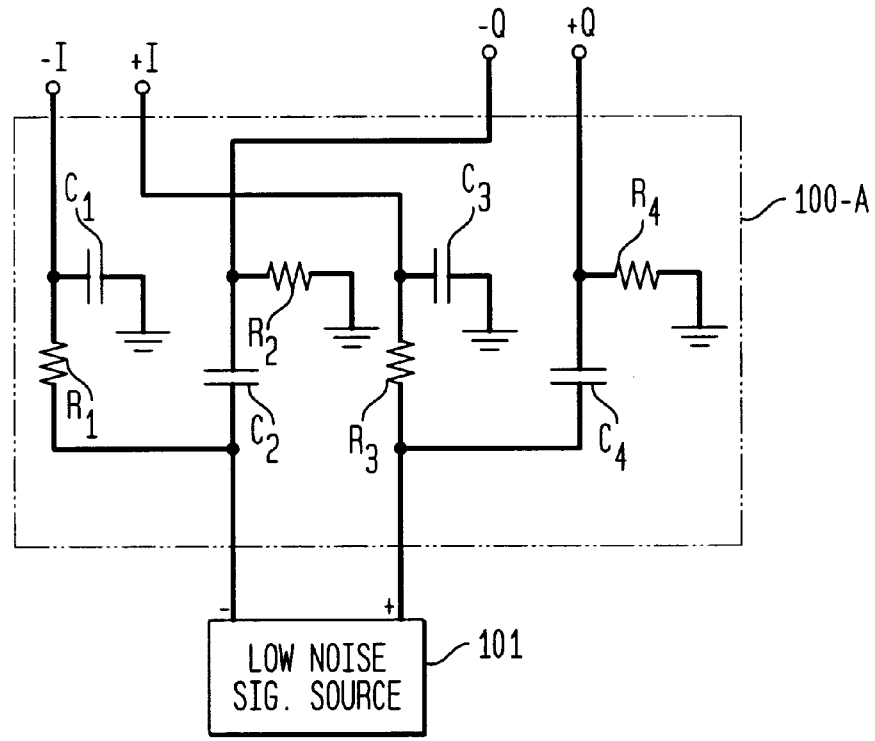
FIGS. 1A and 1B shows electrical block diagrams of exemplary quadrature output signal generators driven by a low noise signal source.

Considering now the drawing figures, reference is first made to FIG. 1A Shown thereat is conventional source 100-A of pairs of quadrature output signals of positive (+) and negative (−) polarity +I, +Q and −I, −Q and which are generated by four sets of R-C and C-R components, having fixed values, coupled to a periodic signal source 101. Signal source 101 as shown is a "low noise" signal source. Such a signal source exhibits, for example, a phase noise which meets a well known and accepted noise standard. Such a standard is, for example, the GSM radio standard of at least −132 dBc/Hz at a 3 MHz offset In FIG. 1A, $R_1$ and $C_1$ and $R_2$ and $C_2$ are connected to the negative (−) polarity output of the periodic signal source 101 and produce −I and −Q output signals. In a like manner, $R_3$ and $C_3$ and $R_4$ and $C_4$ are connected to the positive(+) polarity output of the signal source 101 and generate +I and +Q .output signals. Such an arrangement, however; because of component value tolerances, typically does not produce quadrature signals having a phase difference accuracy better than 1° or 2° deviation from quadrature.

Figure 1B:
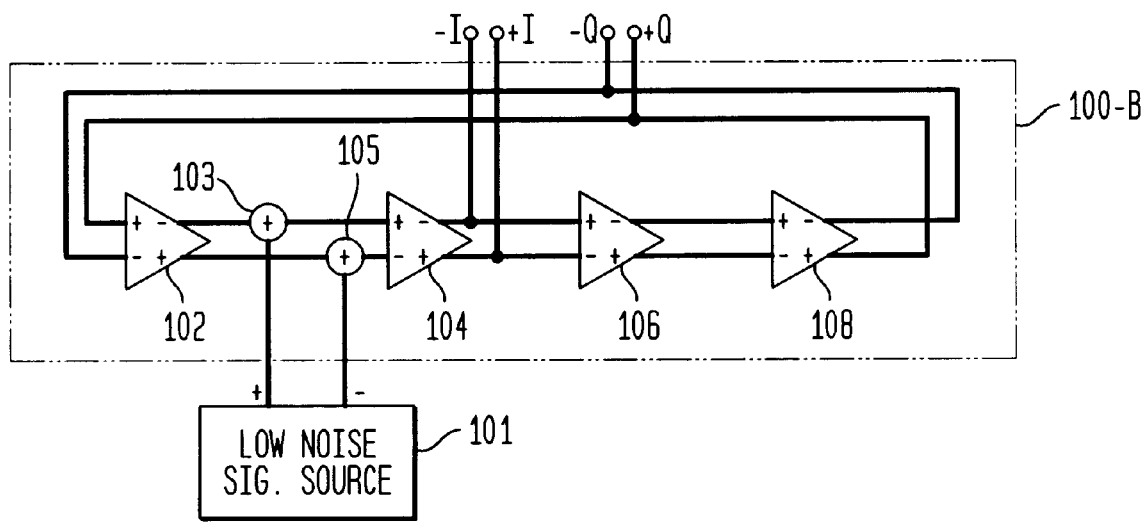

Considering now FIG. 1B, shown thereat is a quadrature signal generator in the form of a four stage ring oscillator 100-B comprised of four differential amplifiers, hereinafter referred to simply as "diff.amps.", 102, 104, 106 and 108 where their non-inverted (+) and inverted (−) outputs are respectively connected to the − and + inputs of the succeeding stage. In such an arrangement, a 45° phase difference exists between the respective inputs and outputs of diff.amps. 102, 104, 106 and 108 with quadrature output signals +I, −I and +Q, −Q appearing, for example, at the outputs of diff.amps. 104 and 108, respectively. Such a ring oscillator by itself, i.e., without an injection source, while being operable to generate quadrature I and Q outputs, the accuracy of their mutual phase difference, i.e., their deviation from quadrature, suffers from long term frequency stability and jitter due to noise typically originating inside the circuit, particularly from the active elements, and thus is not suitable for most RF communications applications.

In accordance with the principles of the invention, by injection locking a differential ring oscillator such as oscillator 100-B with a low-phase noise signal source 101 referred to above, by coupling the +and − outputs thereof to the summing junctions 103 and 105, the low noise signal source 101 operates to pull the frequency of the ring oscillator 100-B into synchronism with that of the source 101. More importantly, it was observed that the phase noise of the output signals I and Q take on the phase noise characteristics of the reference source 101.

Figure 2:
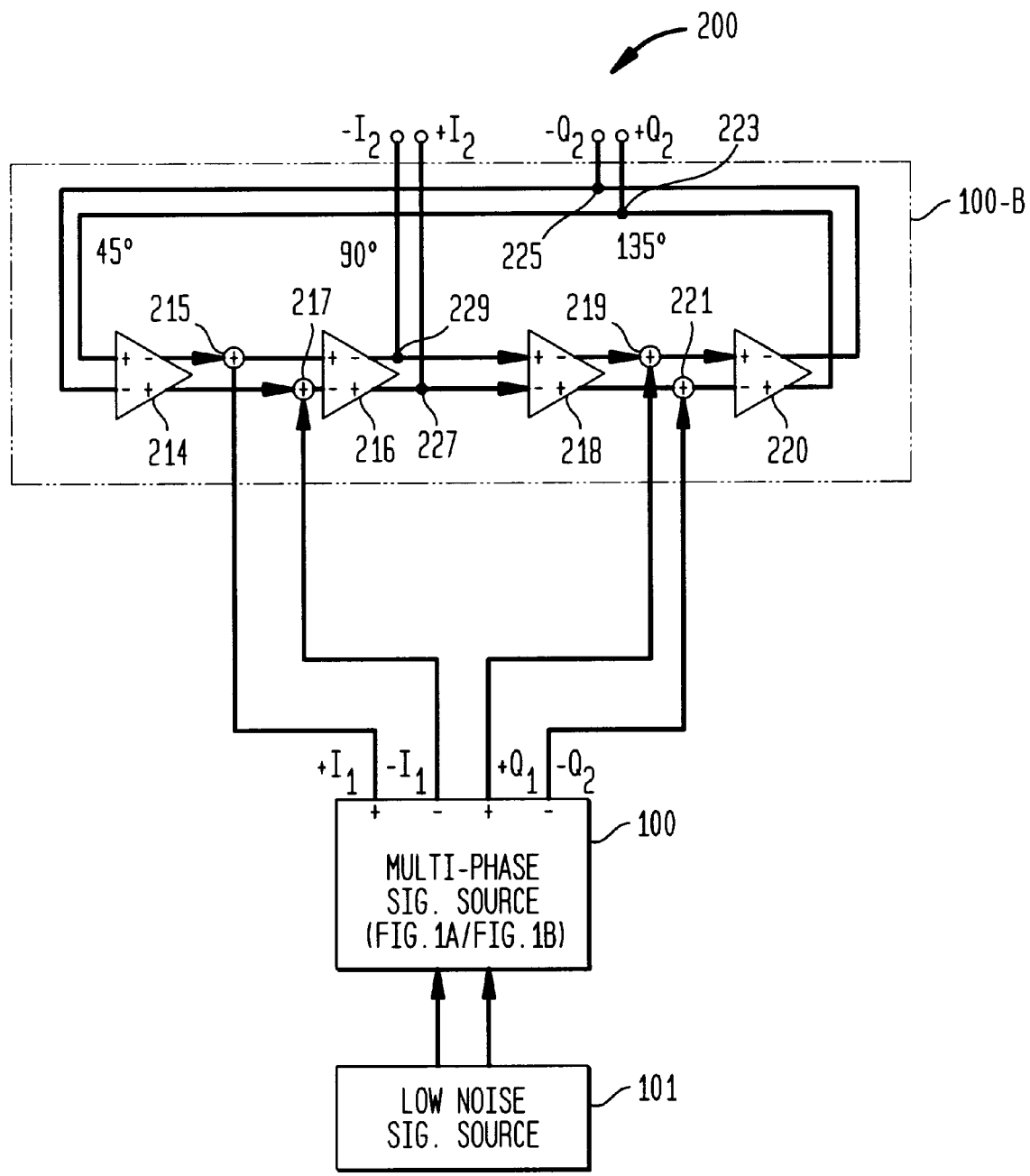
FIG. 2 shows an exemplary electrical block diagram of a differential amplifier quadrature output signal generator according to a first embodiment of the subject invention.

When a ring oscillator is driven at two different points by signals which have a quadrature relationship, two output signals of the ring oscillator exhibit quadrature phase difference accuracy which is substantially better than that of the input signals typically by a factor of at least 10. Such an arrangement is shown in FIG. 2. There quadrature signal outputs $+I_1$, $-I_1$ and $+Q_1$, $-Q_1$ are generated by a multi-phase quadrature signal source 100 driven by a low noise signal source 101, referred to above, and where the ring oscillator 200 is injection locked to the quadrature outputs of the source 100.

As further shown in FIG. 2, the ring oscillator 200 is comprised of four diff.amps. 214, 216, 218, and 220 coupled together in tandem, with the + and − outputs of each stage being coupled to the − and + inputs of the respective succeeding stage. The $+I_1$ and $-I_1$ output from the source 100 are coupled to the + and − inputs of diff.amp. 216 via summing junctions 215 and 217 and the $+Q_1$ and $-Q_1$ outputs from the source 100 are coupled to the + and − inputs of diff.amp. 220 via summing junctions 219 and 221, respectively. A 90° phase difference exists between the inputs of diff.amp 216 and diff.amp. 220 and is provided by intervening diff.amps. 214 and 218. Accordingly, pairs of quadrature outputs $+I_2$, $-I_2$ and $+Q_2$, $-Q_2$ are provided at the outputs of diff.amps. 216 and 220 at circuit junctions 227, 229 and 223, 225, respectively. The quadrature signal outputs of the ring oscillator 200, moreover, have a higher degree of phase accuracy, typically by a factor of ten, than that of the phase accuracy produced by the multi-phase source 100, particularly where it consists of a first ring oscillator such as shown by reference numeral 100-B in FIG. 1B.

Thus, where a first multi-phase signal source generating a plurality of phase related output signals having a first degree of accuracy of mutual phase difference is used to injection lock a second multi-phase signal source generating a second plurality of phase related output signals, the second set of phase related output signals has a degree of accuracy of mutual phase difference which is substantially greater than that of the first source, typically by a factor of 10.

Figure 3:
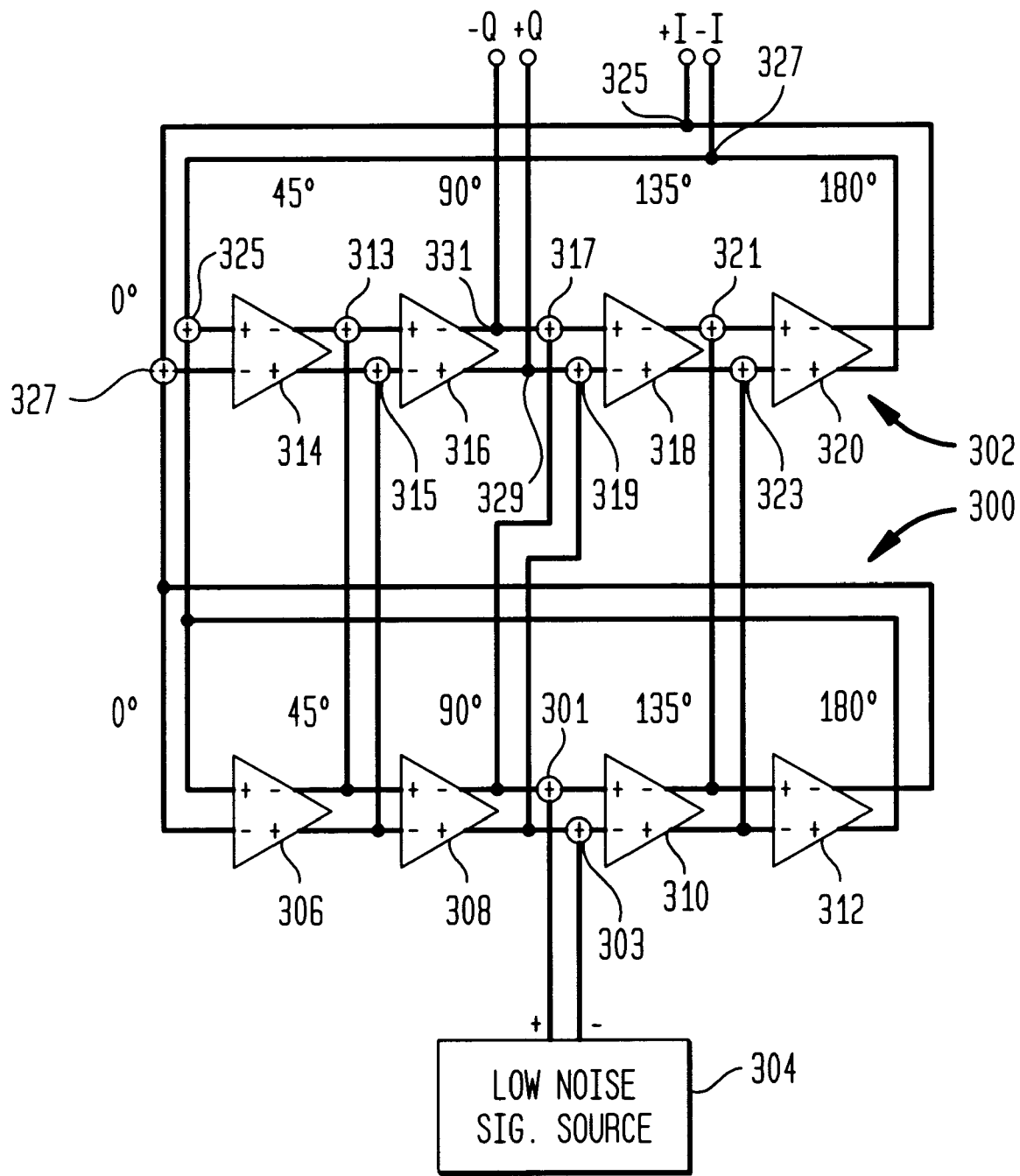
FIG. 3 shows an exemplary electrical block diagram of a differential amplifier quadrature output signal generator according to a second embodiment of the subject invention.

FIG. 3 shows another embodiment of the subject invention including two quadrature ring oscillators 300 and 302. Whereas the embodiment shown in FIG. 2 employs a two point quadrature injection arrangement, the arrangement at FIG. 3 employs four point quadrature injection from a first (lower) oscillator 300 to a second (upper) ring oscillator 302, with the lower ring oscillator 300 being injection locked to a low noise signal source 304 which meets the above referenced GSM radio standard. The lower ring oscillator 300 is comprised of diff.amps. 306, 308, 310 and 312, whereas the upper ring oscillator 302 is comprised of diff.amps. 314, 316, 318 and 320. The + and − polarity signal outputs from diff.amp. 306 are connected to the + and − polarity inputs of diff.amp. 316 via summing junctions 313 and 315, the − and + polarity outputs of diff.amp. 308 are connected to the + and − inputs of diff.amp. 318 via summing junctions 317 and 319, the − and + outputs of diff.amp. 310 are connected to the + and − inputs of diff.amp. 320 via summing junctions 321 and 323, and the − and + polarity outputs of diff.amp. 312 are connected to the + and inputs of diff.amp. 314 via summing junctions 325 and 327. It is to be noted that there is now a double injection from the lower ring oscillator 300 to the upper ring oscillator 302. Pairs of quadrature outputs +I, −I and +Q, −Q are provided at the outputs of diff.amps. 320 and 316 at circuit nodes 325, 327 and 329, 331, respectively. Such an arrangement can provide a quadrature phase difference accuracy in the order of 0.05° over a 40 MHz tuning range at a center frequency of 900 MHz, where the low noise injection locking signal source 304 comprises, for example, an LC oscillator.

The principles of the invention are not limited to an even number of stages, since an odd number of amplifier stages can be employed if desired. Accordingly, the principles of the invention include the generation of multi-phase signals which are mutually shifted in phase by both odd and even integer fraction of 360 degrees, i.e., 360°/n wherer n is either an odd or even whole number. While an even number of stages typically requires that differential amplifiers be used, when an odd number of amplifier stages are desired, either simple inverting amplifiers or differential amplifiers can be utilized.

Figure 4:
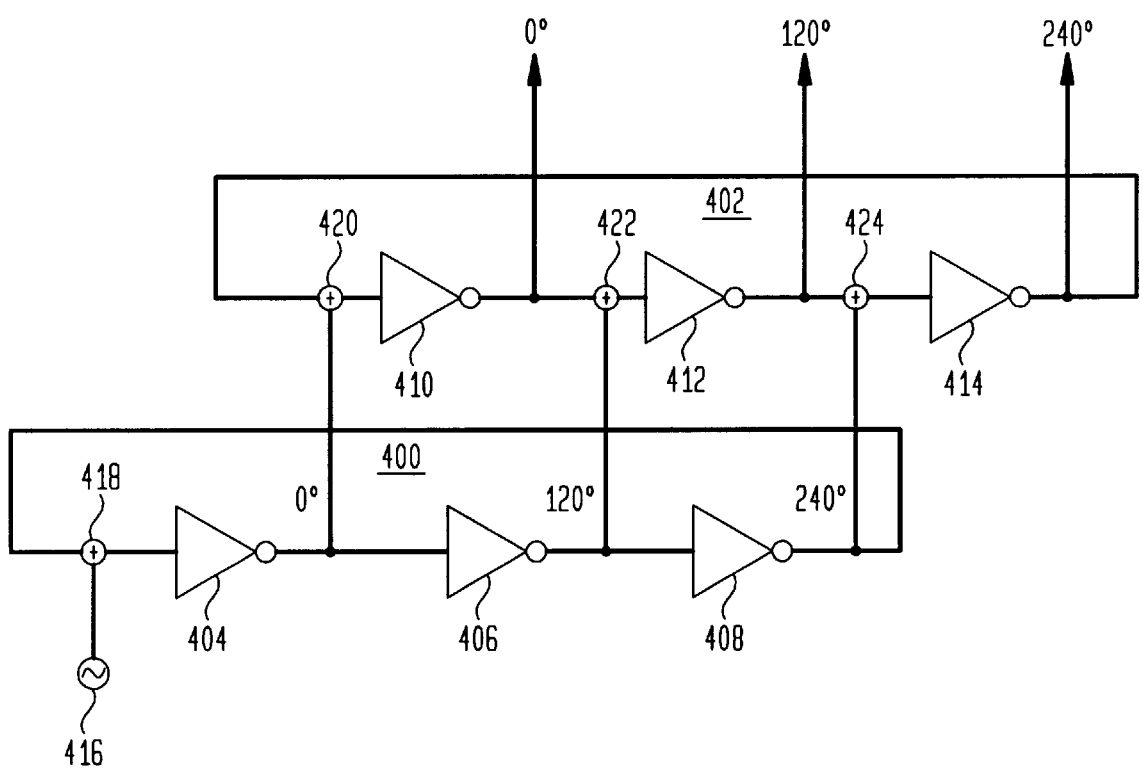
FIG. 4 shows an electrical block diagram of an exemplary multi-phase output signal generator according to a third embodiment of the subject invention.

Referring now to FIG. 4, shown thereat is a cascade of two multi-stage ring oscillators 400 and 402, each implemented with an odd number of amplifier stages, i.e., three inverting amplifiers each. The first ring oscillator 400 is comprised of inverting amplifiers 404, 406 and 408, while the second ring oscillator 402 is comprised of inverting amplifiers 410, 412 and 414. Inverting amplifiers 404 . . . 414 have single non-inverting inputs and single inverting outputs. A low phase-noise reference signal oscillator 416 which also meets the above referenced GSM radio standard is used to injection lock the first ring oscillator 400 by being coupled to the input of inverting amplifier 404 via summing junction 418. The outputs of amplifiers 404, 406 and 408 will have an approximate mutual phase relationship of 0°, 120° and 240°, respectively. These outputs are then used to drive and injection lock the second ring oscillator 402 by having the outputs of amplifiers 404, 406 and 408 coupled to the inputs of amplifiers 410, 412 and 414 via summing junctions 420, 422 and 424. The second ring oscillator 402 is adapted to generate equal amplitude outputs having phase relationship of 0°, 120° and 240°, respectively, at the outputs of amplifiers 410, 412 and 414 as shown. However, these output signals have an accuracy of mutual phase difference which is greater than that of the outputs from the lower ring oscillator 400 by, for example, a factor of ten. As with the quadrature generation scheme, the frequency of the three output signals from ring generator 402 tracks that of the external reference source 416. In every instance, the phase noise of the output signals is improved significantly by the injection locking process over that of a free running ring oscillator.

Figure 5:
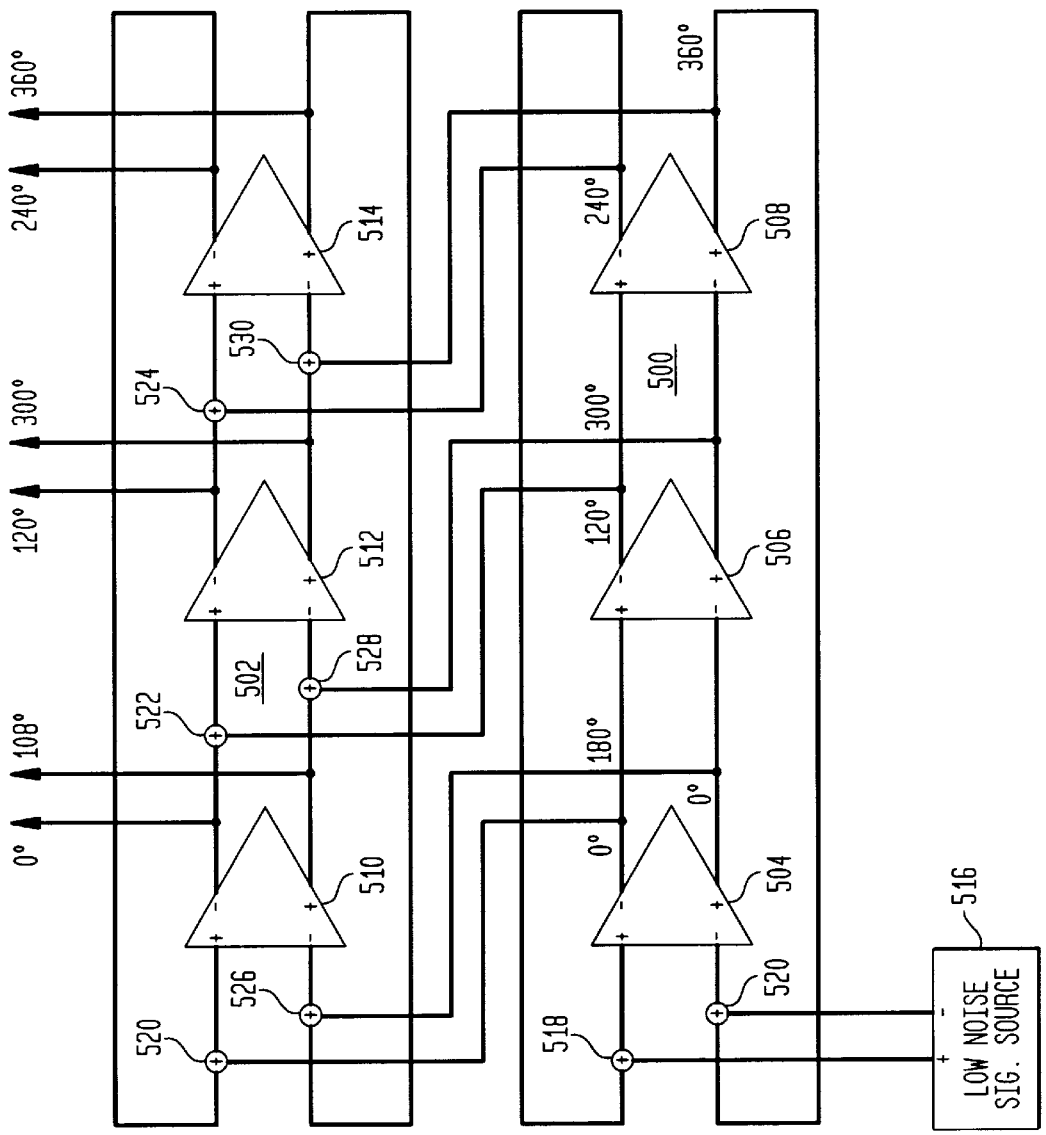
FIG. 5 shows an electrical block diagram of a variation of the embodiment shown in FIG. 4.

A differential amplifier variation of the odd numbered ring oscillator configuration of FIG. 4 is shown in FIG. 5. Depicted there is a cascade of two three-stage ring oscillators 500 and 502 comprised of diff.amps. 504, 506, 508 and 510, 512, 514, respectively. A low noise signal source 516 having + and − outputs which also meet the above referenced GSM radio standard are respectively connected to the + and − inputs of diff.amp. 504 of the lower ring oscillator 500 via summing junctions 518 and 520 so as to inject lock the lower ring oscillator 500. The − and + outputs of diff.amps. 504, 506 and 508 which have a mutual phase relationship of 0°, 180°, 120°, 300°; and 240°, 360° are respectively connected to the + and − inputs of diff.amps. 510, 512, 514 via summing junctions 520, 522, 524 and 526, 528, 530 so as to injection lock the upper ring oscillator 502 with outputs of the lower ring oscillator 500. The three stages of ring oscillator 502 generate outputs of 0°, 180°; 120°, 300°; and 240°, 360° at the − and + outputs of diff.amps. 510, 512, and 514 having an accuracy of mutual phase difference which is greater, for example, by a factor of 10 of the phase accuracy of the output signals generated by the lower ring oscillator 500.

The foregoing detailed description merely illustrates the principles of the invention. It will thus be appreciated that those skilled in the art will be able to devise various arrangements which, although no explicitly described or shown herein, embody the principles of the invention and are thus within its spirit and scope.

We claim:

1. A periodic signal generator, comprising:

signal generator means operating at a predetermined frequency and generating a plurality of phase related output signals having a first value of phase noise, and a first degree of accuracy of mutual phase difference; and, ring oscillator means having a second value of phase noise, when free running, which is greater than said first value of phase noise, coupled to and injection locked to said plurality of phase related output signals generated by said signal generator means for generating a plurality of phase related output signals having a second degree of accuracy of mutual phase difference by summing the phase related output signals into a signal path of the ring oscillator means;

whereby the injection locking of said ring oscillator to the output signals of said means for generating a plurality of phase related output signals results in the operating frequency of the ring oscillator means being equal to the predetermined frequency of said signal generator means and having a phase noise which is less than said second value of phase noise and said second degree of accuracy being greater than the first degree of accuracy.

2. A periodic signal generator, comprising:

means for generating a periodic reference signal having a predetermined frequency and a first value of phase noise;

means coupled to said means for generating said periodic reference signal for generating a first plurality of output signals of said predetermined frequency and having substantially the same value of phase noise as said first value of phase noise, said first plurality of output signals having a mutual phase difference of a first degree of phase difference accuracy; and oscillator means having a second value of phase noise, when free running, which is greater than said first value of phase noise, coupled to and injection locked to said first plurality of output signals for generating a second plurality of output signals by summing the first plurality of output signals into a signal path of said oscillator means, said second plurality of output signals having a mutual phase difference of 360°/n, where n is an integer, and a second degree of phase difference accuracy, and whereby the injection locking of said oscillator means to the output signals of said means for generating output signals of a first degree of phase difference accuracy results in the second degree of phase difference accuracy being greater than the first degree of phase difference accuracy and a phase noise which is substantially equal to the phase noise of said first plurality of output signals.

3. The invention as defined in claim 2 wherein said oscillator means comprises a ring oscillator.

4. A periodic RF signal generator, comprising:

an RF signal source of a plurality of phase related output signals of a predetermined RF frequency and having a first degree of mutual phase difference accuracy and a first value of phase noise; and a ring oscillator connected to said signal source, having a second value of phase noise, when free running, which is greater than said first value of phase noise;

wherein the ring oscillator is a source of a plurality of phase related output signals injection locked to output signals of said signal source and having a second degree of accuracy of mutual phase difference by summing the phase related output signals of the RF signal source into a signal path of the ring oscillator; and whereby the injection locking of said ring oscillator to the output signals of said signal source results in the frequency of the ring oscillator being equal to the predetermined frequency of the RF signal source, said output signals of the ring oscillator having a phase noise substantially equal to said first value of phase noise, said second degree of phase accuracy also being greater than said first degree of phase accuracy.

5. A periodic signal generator, comprising:

a source of a periodic reference signal having a predetermined RF frequency and a first value of phase noise;

a multi-phase output signal source of a plurality of RF output signals connected to said source and having a frequency of said predetermined RF frequency, a substantially said first value of phase noise and having a mutual phase relationship of a first degree of phase difference accuracy;

a ring oscillator operating substantially at said predetermined RF frequency and having a second value of phase noise when free running which is greater than said first value of phase noise connected to the multi-phase RF signal source; and wherein said ring oscillator is a second source of a plurality of RF output signals that can be injection locked to said plurality of RF output signals of said output signal source and which have a mutual phase relationship of 360°/n, where n is an integer, and a second degree of phase accuracy by summing the output signals of the multi-phase output signal source into a signal path of the ring oscillator;

whereby the injection locking of said ring oscillator to said multi-phase output signal source results in the second degree of phase difference accuracy being greater than the first degree of phase difference accuracy and the ring oscillator having a phase noise which is substantially equal to said first value of phase noise of the periodic RF reference signal.

6. A periodic signal generator, comprising:
a multi-phase signal source generating a plurality of phase related output signals having a predetermined frequency, a first value of phase noise or jitter and a mutual phase difference of a first value of phase difference accuracy; and
a ring oscillator having a free running frequency at or about the predetermined frequency of the signal source and having a value of phase noise or jitter, when free running, greater than said first value of phase noise or jitter, injection locked to the output signals of the multi-phase signal source and generating a plurality of phase related output signals having a mutual phase difference of a second value of phase difference accuracy by summing the output signals of the signal source into a signal path of the ring oscillator;
whereby the injection locking of said ring oscillator to the phase related output signals of said multi-phase signal source results in the frequency of ring oscillator being equal to the predetermined frequency of the multi-phase signal source and said signals generated thereby having a phase noise or jitter which is now substantially equal to said first value of phase noise and the second value of phase accuracy being greater than the first value of phase accuracy.

7. A periodic signal generator, comprising:
a reference signal source for generating a periodic output signal of a predetermined frequency and having a phase noise of a first value;
a multi-phase signal source being driven by said reference signal source and generating a plurality of output signals having a mutual phase difference relationship of a first degree of phase difference accuracy and a phase noise of substantially said first value; and
a ring oscillator that can be injection locked to the output signals of the multi-phase signal source, and having a phase noise, when free running, greater than said first value of phase noise and operating at a frequency substantially equal to the frequency of said reference signal source and generating a plurality of output signals having a mutual phase relationship of 360°/n, where n is an integer, and having a second degree of phase difference accuracy by summing the output signals of the multi-phase signal source into a signal path of the ring oscillator;
whereby, upon injection locking of said ring oscillator to said multi-phase signal source, the frequency of the ring oscillator is the same as the predetermined frequency of the reference signal source, the second degree of phase difference accuracy becomes greater than the first degree of phase difference accuracy and the value of the phase noise of the output signals generated by the ring oscillator is substantially equal to the first value of phase noise of said reference signal source over a relatively large bandwidth.

8. The invention as defined in claim 7 wherein said ring oscillator includes a plurality of odd numbered series connected amplifier stages.

9. The invention as defined in claim 8 wherein each of said odd numbered amplifier stages includes an inverting amplifier.

10. The invention as defined by claim 7 wherein said ring oscillator includes a plurality of even numbered series connected amplifier stages.

11. The invention as defined by claim 10 wherein each of said amplifier stages includes a differential amplifier.

12. The invention as defined in claim 7 wherein said multi-phase signal source comprises a resistor and capacitor network providing at least one pair of quadrature output signals.

13. The invention as defined by claim 7 wherein said multi-phase signal source comprises a first ring oscillator injection locked to the periodic output signal of the reference signal source, and
wherein the ring oscillator injection locked to the output signals of the multi-phase signal comprises a second ring oscillator connected to the first ring oscillator.

14. The invention as defined by claim 13 wherein said first and second ring oscillators are connected to one another in a cascade circuit connection.

15. The invention as defined by claim 14 wherein said first and second ring oscillators are both equally comprised of at lease three series connected amplifier stages for generating a plurality of output signals having a mutual phase difference relationship of 360°/n, where n is an odd number.

16. The invention as defined by claim 14 wherein said first and second ring oscillators are both equally comprised of at least four series connected amplifier stages for generating output signals having a mutual phase relationship of 360°/n, where n is an even number.

17. The invention as defined by claim 16 wherein each of said amplifier stages includes a differential amplifier having at least one non-inverted and at least one inverted signal input and at least one non-inverted and at least one inverted signal output.

18. The invention as defined by claim 17 and wherein said periodic output signal generated by said reference signal source includes positive and negative polarity output signals, and
wherein said positive and negative polarity output signals are respectively coupled via summing junctions to said non-inverted and inverted signal inputs of one of said amplifier stages of the first ring oscillator.

19. The invention as defined by claim 13 wherein said first and second ring oscillators include an even number of series connected amplifier stages, and
wherein output signals from said first ring oscillator are applied in quadrature to said second ring oscillator, and
wherein said second ring oscillator generates quadrature output signals.

20. The invention as defined by claim 19 wherein at least two amplifier stages of said second ring oscillator are injection locked to the output signals of at least two amplifier stages of said first ring oscillator, said at least two amplifier stages of both said ring oscillators being separated by at least one respective intermediate amplifier stage.

21. The invention as defined by claim 20 wherein both said ring oscillators are equally comprised of at least four amplifier stages, and
wherein said at least one intermediate amplifier stage comprises two respective intermediate amplifier stages.

22. The invention as defined by claim 20 wherein each of said amplifier stages includes a differential amplifier having at least one non-inverted and at least one inverted signal input and at least one non-inverted and at least one inverted signal output for generating pairs of quadrature output signals of mutually opposite polarity.

23. The invention as defined by claim 13 wherein every other stage of said first ring oscillator is coupled in a predetermined sequence to every other stage of said second ring oscillator.

24. The invention as defined by claim 13 wherein an output of each stage of said first ring oscillator is coupled to an input of a corresponding successive stage of said second ring oscillator.

25. The invention as defined by claim 13 wherein an output of each stage of said first ring oscillator is coupled to an input of a corresponding preceding stage of said second stage of said second ring oscillator.

26. The invention as defined by claim 13 wherein said reference signal source comprises an RF signal source of a predetermined RF frequency and
   said first and second ring oscillators have a free running operating frequency equal to or substantially equal to said predetermined RF frequency of the RF signal source.

27. A method of generating a plurality of phase related periodic output signals, comprising the steps of:
   generating a periodic output signal of a predetermined reference frequency and having a first value of phase noise which meets a predetermined noise standard;
   generating a plurality of phase-related intermediate output signals having a first degree of phase difference accuracy from said periodic output signal, and
   injection locking a ring oscillator operating at or about said predetermined reference frequency and having a second value of phase noise, when free running, greater than said first value of phase noise with said plurality of intermediate output signals and generating a plurality of phase-related output signals having a second degree of phase difference accuracy from said intermediate output signals by summing the intermediate output signals into a signal path of the ring oscillator;
   whereby the injection locking of said ring oscillator to said intermediate output signals results in the second degree of phase difference accuracy being substantially greater than the first degree of phase difference accuracy and the phase noise of said output signals having a value which is equal to or approximately equal to said first value of phase noise.

28. The method as defined by claim 27 wherein said ring oscillator includes an odd numbered plurality of series connected amplifier stages for generating a plurality of output signals having a mutual phase difference relationship of 360°/n, where n is an odd number.

29. The method as defined by claim 27 wherein said ring oscillator includes at least three series connected amplifiers for generating at least two output signals having a mutual phase difference of 120°.

30. The method as defined by claim 27 wherein said ring oscillator includes an even numbered plurality of series connected amplifier stages for generating a plurality of output signals having a mutual phase difference relationship of 360°/n, where n is an even number.

31. The method as defined by claim 27 wherein said ring oscillator includes at least four series connected amplifier stages for generating at least one pair of quadrature output signals.

32. The method as defined by claim 27 wherein said predetermined noise standard comprises a GSM radio standard of at least 132 dBc/Hz at a 3 MHz offset.

33. The invention as defined by claim 27 wherein said predetermined reference frequency of the periodic output signal comprises an RF frequency and wherein the ring oscillator has a free running frequency equal to or substantially equal to said RF frequency.

* * * * *